(12) United States Patent
Kawaguchi

(10) Patent No.: US 10,314,220 B2
(45) Date of Patent: Jun. 4, 2019

(54) MOUNTING MACHINE AND COMPONENT DETECTION METHOD

(71) Applicant: FUJI CORPORATION, Chiryu (JP)

(72) Inventor: Koji Kawaguchi, Kasugai (JP)

(73) Assignee: FUJI CORPORATION, Chiryu (JP)

( * ) Notice: Subject to any disclaimer, the term of this patent is extended or adjusted under 35 U.S.C. 154(b) by 252 days.

(21) Appl. No.: 14/911,183

(22) PCT Filed: Aug. 9, 2013

(86) PCT No.: PCT/JP2013/071639
§ 371 (c)(1),
(2) Date: Feb. 9, 2016

(87) PCT Pub. No.: WO2015/019487
PCT Pub. Date: Feb. 12, 2015

(65) Prior Publication Data
US 2016/0192553 A1 Jun. 30, 2016

(51) Int. Cl.
*B23P 19/00* (2006.01)
*H05K 13/08* (2006.01)
*H05K 13/04* (2006.01)

(52) U.S. Cl.
CPC ........... *H05K 13/08* (2013.01); *H05K 13/041* (2018.08); *H05K 13/0404* (2013.01); *H05K 13/0812* (2018.08)

(58) Field of Classification Search
CPC ....... B23K 1/203; H01L 24/742; H01L 24/75; H01L 24/81; H05K 3/0097; H05K 3/303;
(Continued)

(56) References Cited

U.S. PATENT DOCUMENTS 5,825,914 A * 10/1998 Tsuboi ............... G06T 7/66
382/151
6,718,626 B2 * 4/2004 Kawada ............ H05K 13/0413
29/712
(Continued)

FOREIGN PATENT DOCUMENTS

CN 102883593 A 1/2013
JP 1-169587 A 7/1989
(Continued)

OTHER PUBLICATIONS

Japanese Office Action dated Jun. 6, 2017 in Patent Application No. 2015-530640 (with English translation).
(Continued)

*Primary Examiner* — Paul D Kim
(74) *Attorney, Agent, or Firm* — Oblon, McClelland, Maier & Neustadt, L.L.P.

(57) ABSTRACT

A mounting machine which mounts one or more components on a substrate includes: a mounting head which has a fiducial mark, holds the component, and moves the component onto the substrate; an imaging section which images the mounting head; setting means for setting, out of image data of the fiducial mark and component held by the moving mounting head captured by the imaging section, a processing region containing the component, based on the position of the fiducial mark; and detection means for detecting a state of the component which is held by the mounting head by processing the image data of the set processing region.

12 Claims, 7 Drawing Sheets

(58) Field of Classification Search
CPC .... H05K 3/341; H05K 3/3468; H05K 3/3473; H05K 3/3494; H05K 13/08; H05K 13/0465
See application file for complete search history.

(56) References Cited

U.S. PATENT DOCUMENTS

| | | | | |
|---|---|---|---|---|
| 6,739,036 | B2 * | 5/2004 | Koike | H05K 13/0413 29/720 |
| 6,915,565 | B2 * | 7/2005 | Isogai | H05K 13/0413 29/720 |
| 6,941,646 | B2 * | 9/2005 | Suhara | H05K 13/0069 29/739 |
| 6,952,869 | B2 * | 10/2005 | Suhara | H05K 13/0015 29/720 |
| 6,999,835 | B2 * | 2/2006 | Kodama | G05B 19/4065 700/108 |
| 7,043,820 | B2 * | 5/2006 | Suhara | H05K 13/02 29/564.1 |
| 2002/0029468 | A1 | 3/2002 | Koike et al. | |
| 2002/0031279 | A1 | 3/2002 | Shimizu | |
| 2002/0035783 | A1 | 3/2002 | Kawada | |

FOREIGN PATENT DOCUMENTS

| | | | |
|---|---|---|---|
| JP | 2002-94296 A | | 3/2002 |
| JP | 2002-185198 A | | 6/2002 |
| JP | 2005197564 A | * | 7/2005 |
| JP | 2005-286241 A | | 10/2005 |

OTHER PUBLICATIONS

International Search Report dated Sep. 17, 2013 in PCT/JP13/071639 Filed Aug. 9, 2013.
Extended European Search Report dated Jul. 14, 2016 in Patent Application No. 13891019.5.
Combined Office Action and Search Report dated Feb. 9, 2018 in Chinese Patent Application No. 201380078705.9 (with partial English language translation and English translation of categories of cited documents), 14 pages.

* cited by examiner (a)

(b)

MOUNTING MACHINE AND COMPONENT DETECTION METHOD

TECHNICAL FIELD

The present disclosure relates to a mounting machine and a component detection method.

BACKGROUND ART

In the related art, there is proposed a mounting machine which is provided with a detection target portion in a position which can be imaged at the same time as a component which is sucked by a suction nozzle, detects a relative positional relationship between the rotational center of the suction nozzle and the detection target portion in advance, images the sucked component and the detection target portion at the same time, and acquires the positional shifting of the center on the component based on the aforementioned relative positional relationship (for example, refer to PTL 1). In this device, it is possible to increase the detection precision of the positional shifting of the component in relation to the rotational center of the suction nozzle.

CITATION LIST

Patent Literature

PTL 1: JP-A-2002-185198

SUMMARY

Incidentally, when detecting the positional shifting of the component, the component which is sucked by the suction nozzle may be imaged while moving. In this case, although it is possible to obtain a reduction in the time of the mounting process, shifting may arise in the timing even if the imaging is performed when the component passes over the imaging section. In this case, in comparison to a case in which the component is stopped and imaged, it is necessary to perform the detection of the positional shifting of the component by analyzing the image data of a greater range, and there is a problem that the processing takes time. Thus, there is a demand to increase the efficiency of the process of detecting the holding state of the component.

The disclosure was made in light of this problem, and a main object of the disclosure is to provide a mounting machine and a component detection method which are capable of more efficiently detecting the holding state of a moving component.

The disclosure adopts the following means in order to achieve the main object described above.

In other words, a mounting machine of the disclosure mounts one or more components on a substrate, and includes: a mounting head which has a fiducial mark, holds the component, and moves the component onto the substrate; an imaging section which images the mounting head; setting means for setting, out of image data of the fiducial mark and component held by the moving mounting head captured by the imaging section, a processing region containing the component, based on the position of the fiducial mark; and detection means for detecting a state of the component which is held by the mounting head by processing the image data of the set processing region.

In this mounting machine, out of image data of the fiducial mark and component held by the moving mounting head captured by the imaging section, a processing region containing a component is set, based on the position of the fiducial mark, and a state of the component which is held by the mounting head is detected by processing the image data of the set processing region. When the moving mounting head is imaged, there is a case in which shifting arises in the position of the mounting head. Therefore, out of the captured image data, the processing region in which the component is thought to be contained may need to be enlarged to a region which takes the positional shifting amount of the mounting head into account. In this mounting machine, since the fiducial mark of the mounting head is first used as a reference, it is possible to set the processing region in which the component is anticipated to be contained in the image to a smaller region which does not take the positional shifting amount of the mounting head into consideration. Therefore, in this mounting machine, it is possible to more efficiently detect the holding state of the moving component.

In the mounting machine of the disclosure, the setting means may set the processing region taking into account the size of the component and the positional shifting amount of the component. In this case, it is possible to set the processing region to a narrower range, and this is preferable. Here, the positional shifting amount of the component which is taken into account in the processing region may be a value which is obtained empirically.

In the mounting machine of the disclosure, the imaging section may transfer the image data of the set processing region out of the captured image data to the detection means, and the detection means may process the image data of the transferred processing region. In this case, in comparison to a case in which all of the captured image data is transferred, since it is possible to further reduce the transferred data amount, it is possible to more efficiently detect the holding state of the moving component.

In the mounting machine of the disclosure, the mounting head may hold a plurality of components, and the setting means may set a plurality of processing regions corresponding to the components. In the mounting head which holds the plurality of components, since the mounting head has more processing regions, it is highly significant to apply the disclosure in which the holding state of the component is efficiently detected. For example, when the processing regions in which the components are contained overlap each other, it may not be possible to detect the states of the components which are held by the mounting head. In the disclosure, since it is possible to reduce the size of each of the processing regions, it is possible to further suppress the overlapping of the processing regions of the components, and it is possible to perform the detection of the holding states of the components. It is possible to perform the detection of the holding states of the components even for larger components.

In the mounting machine of the disclosure, the mounting head may hold the plurality of components on a circular circumference and may have the fiducial mark on a center portion of the circular circumference. In this case, since it is easy to image the components and the fiducial mark in the same image, it is possible to more reliably detect the holding states of the moving components.

In the mounting machine of the disclosure, the mounting head may have the fiducial mark containing detection points arranged on a rectangle. In this case, it is more reliably obtain a fiducial position, and thus, it is possible to more reliably detect the holding state of the moving component.

Note that, the mounting machine of the disclosure may be provided with control means for moving the mounting head in a state of holding the component, and for causing the imaging section to image the component which is held by the mounting head which is moving in an imaging range of the imaging section and the fiducial mark.

In the mounting machine of the disclosure, the setting means may perform detection of the fiducial mark on a predetermined region which is smaller than a region of the image data, and may set the processing region based on the position of the fiducial mark which is detected. In this case, it is possible to more efficiently perform the detection of the fiducial mark in comparison with performing the detection of the fiducial mark in relation to the entirety of the image data. Here, the fiducial mark may be formed on the center portion of the plurality of held components, and the setting means may perform the detection of the fiducial mark on a predetermined center region which is smaller than a region of the image data.

A component detection method of the disclosure is the component detection method of a mounting machine which mounts one or more components on a substrate and includes a mounting head which has fiducial mark, holds the component, and moves the component onto the substrate and an imaging section which images the component held by the mounting head and the fiducial mark, the method including (a) a step of setting, out of image data of the fiducial mark and component held by the moving mounting head captured by the imaging section, a processing region containing the component, based on the position of the fiducial mark, and (b) a step of detecting a state of the component which is held by the mounting head by processing the image data of the set processing region.

In this component detection method, in the same manner as the mounting machine described above, since the fiducial mark of the mounting head is first used as a reference, it is possible to set the processing region in which the component is anticipated to be contained to a smaller region which does not take the positional shifting amount of the mounting head into consideration. Therefore, it is possible to more efficiently detect the holding state of the moving component. Note that, in the component detection method, various modes of the mounting machine described above may be adopted, and, steps which realize the functions of the mounting machine described above may be added.

DETAILED DESCRIPTION

Figure 1:
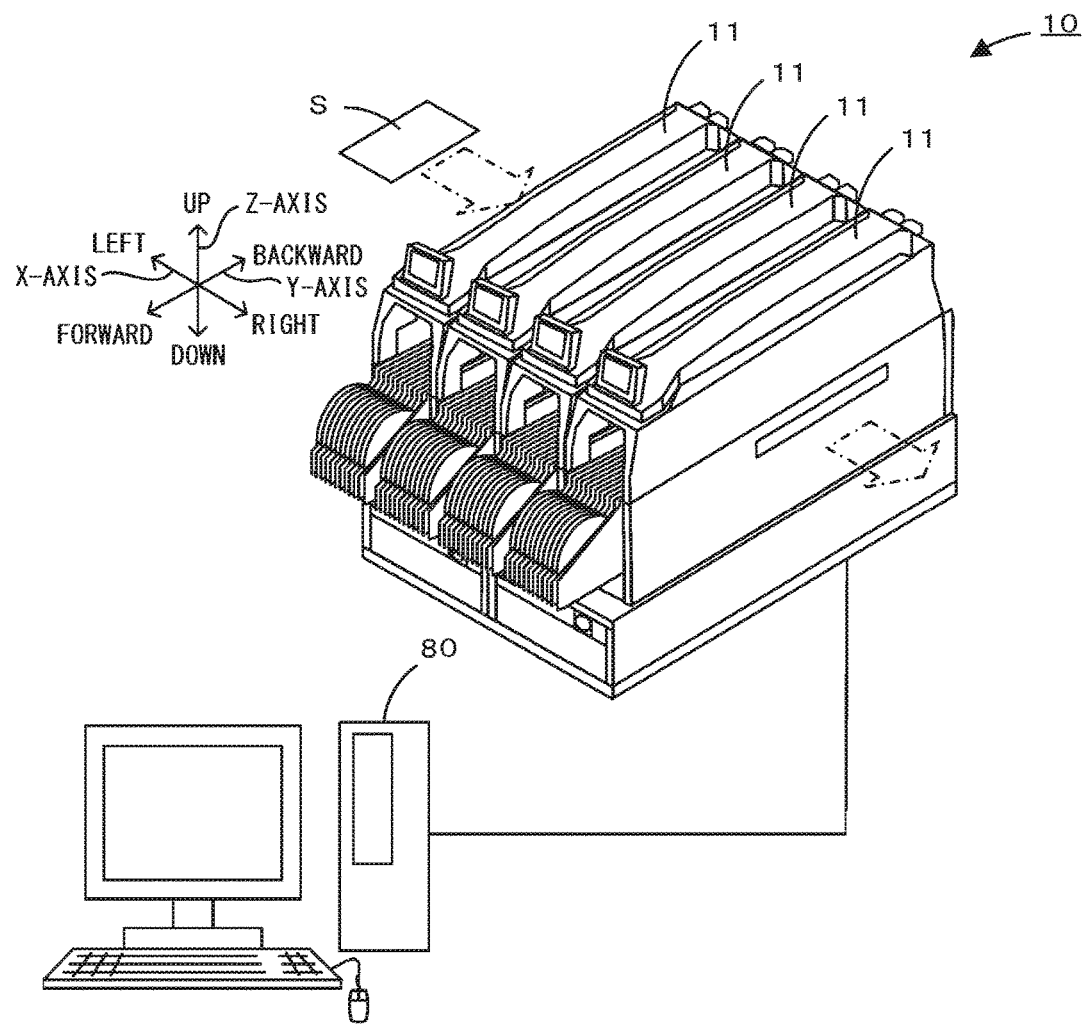
FIG. 1 is a schematic diagram of a component mounting system 10.
Figure 2:
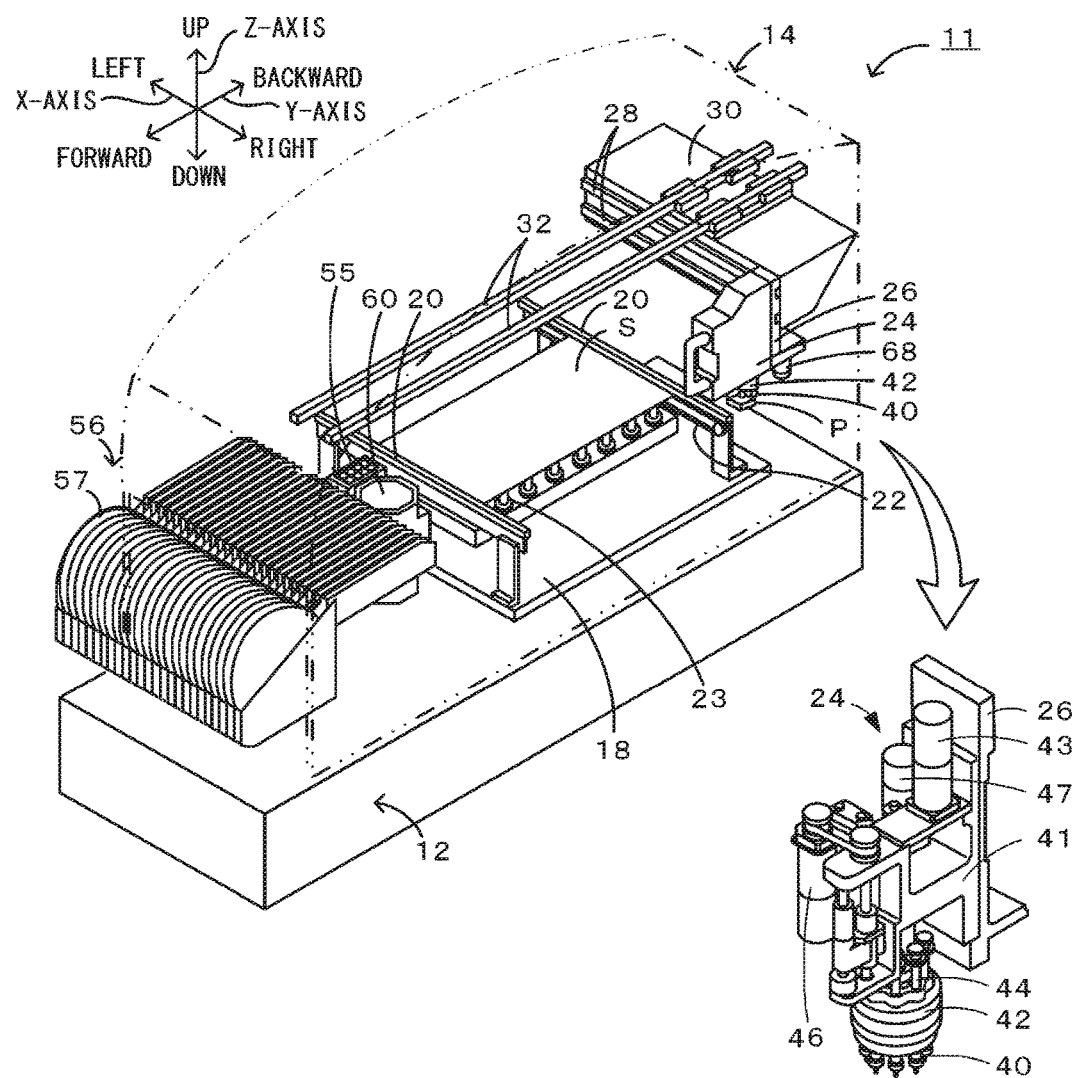
FIG. 2 is a perspective view of a mounting machine 11.
Figure 3:
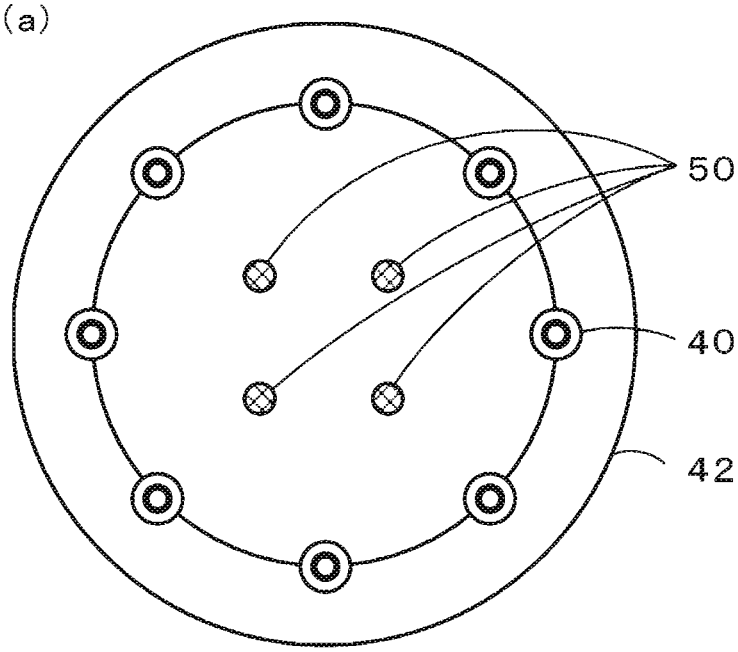
FIG. 3A and FIG. 3B are explanatory diagrams of a nozzle holding body 42 as viewed from below.
Figure 3:
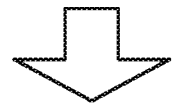
Figure 3:
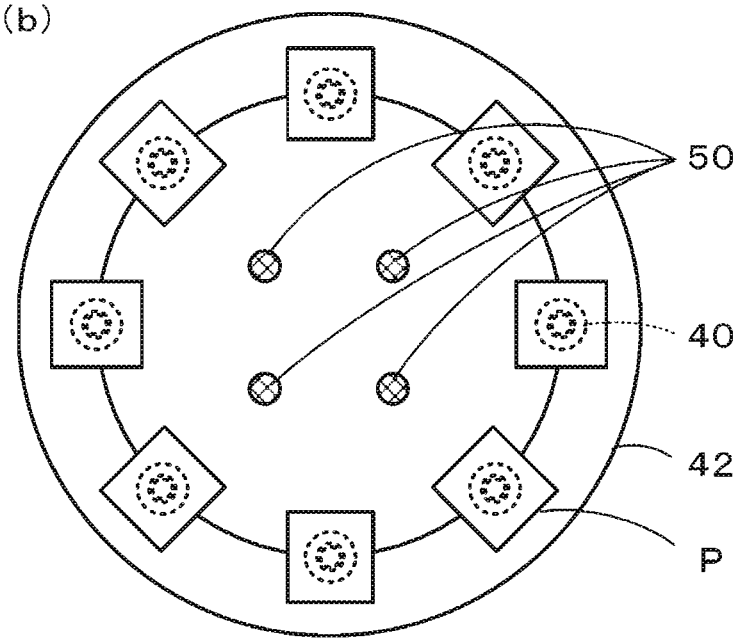
Figure 4:
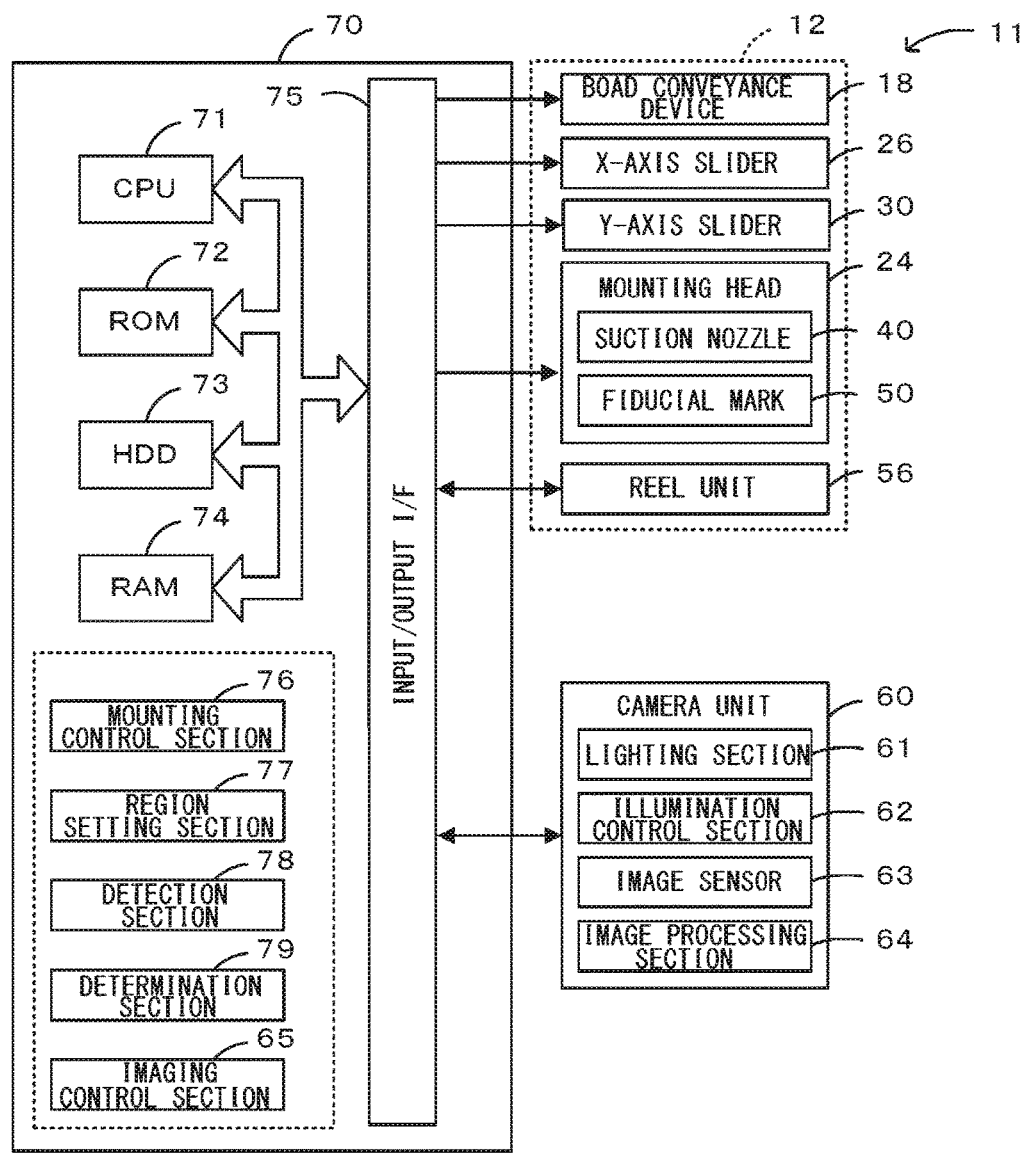
FIG. 4 is a block diagram representing the electrical connection relationships of the mounting machine 11.

Hereinafter, description will be given of a favorable embodiment of the disclosure with reference to the drawings. FIG. 1 is a schematic diagram of the component mounting system 10. FIG. 2 is a perspective view of the mounting machine 11. FIGS. 3A and 3b are explanatory diagrams of the nozzle holding body 42 as viewed from below, FIG. 3A is an explanatory diagram in which no components P are held, and FIG. 3B is an explanatory diagram in which the components P are held. FIG. 4 is a block diagram representing the electrical connection relationships of the mounting machine 11. Note that, in the present embodiment, the left-right directions (an X axis), the forward-backward directions (a Y axis), and the up-down directions (a Z axis) are as illustrated in FIG. 1 and FIG. 2. The mounting process includes processes such as arranging, mounting, inserting, bonding, and attaching a component onto a substrate.

The component mounting system 10 is provided with the mounting machines 11 which are configured as a mounting line, and a management computer 80 which manages information of the components to be mounted and the like. In the component mounting system 10, the plurality of mounting machines 11, each of which carries out a mounting process in which an electronic component (hereinafter referred to as the "component P") is mounted on a substrate S, are arranged from upstream to downstream. The plurality of mounting machines 11 are provided with the same configuration. As illustrated in FIG. 2, the mounting machine 11 is provided with a base 12, a mounting machine main body 14 which is installed on the base 12, and a reel unit 56 onto which a reel 57 which stores the components P is mounted. The base 12 is a heavy item formed as a rectangular parallelepiped, and casters which are not depicted in the drawings are attached to the four corners of the reverse surface.

The mounting machine main body 14 is installed on the base 12 in an exchangeable manner. The mounting machine main body 14 is provided with a board conveyance device 18 which conveys the substrate S, a mounting head 24 capable of moving in the XY plane, suction nozzles 40 which are attached to the mounting head 24 and are capable of moving in the Z-axis directions, a camera unit 60 which images the components P which are sucked by the suction nozzles 40, a nozzle stocker 55 which stocks plural types of the suction nozzle 40 which can be attached to the mounting head 24, and a control device 70 (refer to FIG. 4) which executes various control.

The board conveyance device 18 is provided with the supporting boards 20 and 20 which are provided to leave an interval in the forward-backward of FIG. 2 and which extend in the left-right directions, and conveyor belts 22 and 22 (only one illustrated in FIG. 2) which are provided on surfaces of both the supporting boards 20 and 20 which face each other. The conveyor belts 22 and 22 bridge across a drive wheel and a driven wheel which are provided on the left and right of the supporting boards 20 and 20 so as to be endless. The substrate S is placed on the top surfaces of the pair of conveyor belts 22 and 22 and is conveyed from the left to the right. The substrate S is supported by support pins 23, a multitude of which are provided to stand on the reverse surface side.

The mounting head 24 holds (sucks) the component P and moves the component P onto the substrate S, and is attached to the front surface of the X-axis slider 26. The X-axis slider 26 is attached to the front surface of the Y-axis slider 30 capable of sliding in the forward-backward directions such that the X-axis slider 26 is capable of sliding in the left-right directions. The Y-axis slider 30 is attached to a pair of guide rails 32 and 32 which are provided on the left and right to extend in the forward-backward directions such that the Y-axis slider 30 is capable of sliding. Note that, the guide rails 32 and 32 are fixed to the inner portion of the mounting machine 11. A pair of guide rails 28 and 28 which are provided on the top and bottom to extend in the left-right directions are provided on the front surface of the Y-axis slider 30, and the X-axis slider 26 is attached to the guide rails 28 and 28 to be capable of sliding in the left-right directions. The mounting head 24 moves in the left-right directions in accordance with the movement of the X-axis slider 26 in the left-right directions, and moves in the forward-backward directions together with the movement of the Y-axis slider 30 in the forward-backward directions. Note that, each of the sliders 26 and 30 is driven by a corresponding drive motor.

As illustrated in FIG. 2, the mounting head 24 includes a head main body 41 which is detachably mounted to the X-axis slider 26. The nozzle holding body 42 is supported by the head main body 41 to be capable of intermittent rotation, and is intermittently rotated by a rotation device which uses a motor 43 as a drive source. A plurality of nozzle holders 44 is held on the circular circumference of the nozzle holding body 42 to be capable of being lifted and lowered, and the suction nozzles 40 which sucks the component are detachably mounted to each of the nozzle holders 44. The nozzle holder 44 which is positioned in a predetermined angular position by the intermittent rotation of the nozzle holding body 42 is lifted and lowered in the Z-axis directions (the up-down directions) which orthogonally intersect the X-axis and Y-axis directions by a holder lifting and lowering device which uses a Z-axis motor 46 as a drive source. The nozzle holder 44 is capable of sucking the component P using the suction nozzle 40, and of mounting the component P to the substrate S. The nozzle holder 44 is rotated (is turned on its axis) by a holder rotation device which uses a motor 47 as drive source, and is able to adjust the angle of the component P which is sucked by the suction nozzle 40.

As illustrated in FIGS. 3A and 3b, fiducial mark 50 which is used for detecting the position of the mounting head 24 is formed on the bottom surface, which can be imaged by the camera unit 60, of the mounting head 24. For example, in this mounting head 24, the plurality of (here, eight) suction nozzles 40 are mounted on the circular circumference of the nozzle holding body 42, the plurality of components P is sucked on this circular circumference, and the fiducial mark 50 is present in the center portion of the circular circumference. As illustrated in FIG. 3B, the fiducial mark 50 is formed in the center portion of the mounting head 24 which can be recognized from below, even in a state in which the suction nozzles 40 sucks the components P. The fiducial mark 50 contains four detection points which are arranged on a rectangle. The fiducial mark 50 is formed in a different color (for example, red) from the peripheral members, and is easy to detect by image processing.

Using pressure, the suction nozzle 40 sucks a component at the nozzle distal end, releases the component sucked at the nozzle distal end. The suction nozzle 40 is connected to one of a vacuum pump and an air pipe via an electromagnetic valve. When the electromagnetic valve is controlled such that the vacuum pump communicates with the suction nozzle 40, the inner portion of the suction nozzle 40 becomes a negative pressure and the component P is sucked at the distal end. Meanwhile, when the electromagnetic valve is controlled such that the air pipe communicates with the suction nozzle 40, the inner portion of the suction nozzle 40 becomes a positive pressure and the component P sucked at the distal end is released.

As illustrated in FIG. 2, the camera unit 60 is a unit which images the component P sucked by the mounting head 24 and the fiducial mark 50 which is present on the mounting head 24, and is arranged on the front of the supporting board 20 of the front side of the board conveyance device 18. The imaging range of the camera unit 60 is above the camera unit 60. As illustrated in FIG. 4, the camera unit 60 is provided with a lighting section 61 which irradiates the component P sucked by the mounting head 24 with light, and an illumination control section 62 which controls the lighting section 61. The camera unit 60 is provided with an image sensor 63 which generates a charge by receiving light and outputs the generated charge, and an image processing section 64 which generates image data based on the charge which is input from the image sensor 63. Although the image sensor 63 may be a CCD, it is preferable to use a CMOS. This is because it is easy to transfer a portion of the image. The image processing section 64 executes a process of transferring the image data of a processing region which is set by a region setting section 77 described later in detail, among the captured image data, to the control device 70. When the suction nozzle 40 which sucks the component P passes over the camera unit 60, the camera unit 60 images the component P sucked by the suction nozzle 40 and the fiducial mark 50 and outputs a portion of the imaged result to the control device 70.

As illustrated in FIG. 4, the control device 70 is configured as a microprocessor centered on the CPU 71, is provided with a ROM 72 which stores process programs, an HDD 73 which stores various data, a RAM 74 which is used as a working region, an input-output interface 75 for performing transactions of electrical signals with an external device, and the like, and these are electrically connected via a bus. The control device 70 outputs drive signals to the board conveyance device 18, the drive motors of the X-axis slider 26 and the Y-axis slider 30, the Z-axis motor 34 of the mounting head 24, and the electromagnetic valve, and outputs an imaging signal to the camera unit 60. The control device 70 receives input of an image signal from the camera unit 60. The control device 70 is connected to the reel unit 56, the camera unit 60, and the management computer 80 to be capable of bidirectional communication. Note that, the sliders 26 and 30 are equipped with position sensors which are not depicted in the drawings, and the control device 70 controls the drive motors of the sliders 26 and 30 while receiving the input of positional information from these position sensors.

The control device 70 is provided with a mounting control section 76, the region setting section 77, a detection section 78, a determination section 79, and an imaging control section 65 as functional blocks. The mounting control section 76 executes a process of mounting the components P based on mounting condition information containing conditions such as the size and the disposition position of each of the components P. The mounting control section 76 manages the position (X-Y coordinate) of the mounting head 24 by acquiring the positional information of the drive motor axes of the X-axis slider 26 and the Y-axis slider 30. For example, the mounting condition information contains information such as the shape and the size of the component and the disposition position on the substrate S, and is managed by the management computer 80. The region setting section 77 executes a process of setting, out of image data of the fiducial mark 50 and one or more components P sucked by the moving mounting head 24 captured by the camera unit 60, the processing region containing the components P, based on the position of the fiducial mark 50. When the plurality of components P is sucked by the suction nozzles 40, the region setting section 77 sets a plurality of processing regions corresponding to each of the components P. When the region setting section 77 sets a processing region containing the component P in the image data, the region setting section 77 sets a processing region taking into account the size of the component P and the positional shifting amount of the component P. The detection section 78 executes a process of detecting the state of the component P which is sucked by the mounting head 24 by processing the image data of the set processing region. The detection section 78 executes a process of detecting the shifting amount and the suction angle of the component P which is sucked by the suction nozzle 40 according to the difference between the center position of the component P and the center position of the suction nozzle 40, using an image of the mounting head 24 when no components are mounted as a reference. The detection section 78 detects the suction state of the component P in the mounting head 24 based on the captured image. The determination section 79 executes a process of determining whether to use the sucked component in the mounting process based on whether the detected shifting amount is greater than a threshold which is predetermined empirically, or, based on whether the shape of the component differs from a reference value. The imaging control section 65 executes a process of outputting a signal which causes the camera unit 60 to image the component P which is sucked by the mounting head 24 which is moving in the imaging range of the camera unit 60 and the fiducial mark 50. For example, the imaging control section 65 acquires the position of the managed mounting head 24 every control period of the drive motor axes of the X-axis slider 26 and the Y-axis slider 30, and when the acquired position is a position above the camera unit 60, outputs an imaging signal.

The management computer 80 is a computer which manages information of the plurality of mounting machines 11, and is provided with a controller which is formed of a CPU, a ROM, a RAM, and the like, and manages the control of the overall device, a communication section which performs communication with external equipment such as the mounting machines 11, and a memory section which stores various application programs and various data files. In the management computer 80, the mounting condition information is stored in the memory section, and the management computer 80 transmits the mounting condition information to the mounting machines 11 according to requests from the mounting machines 11 and the like.

Figure 5:
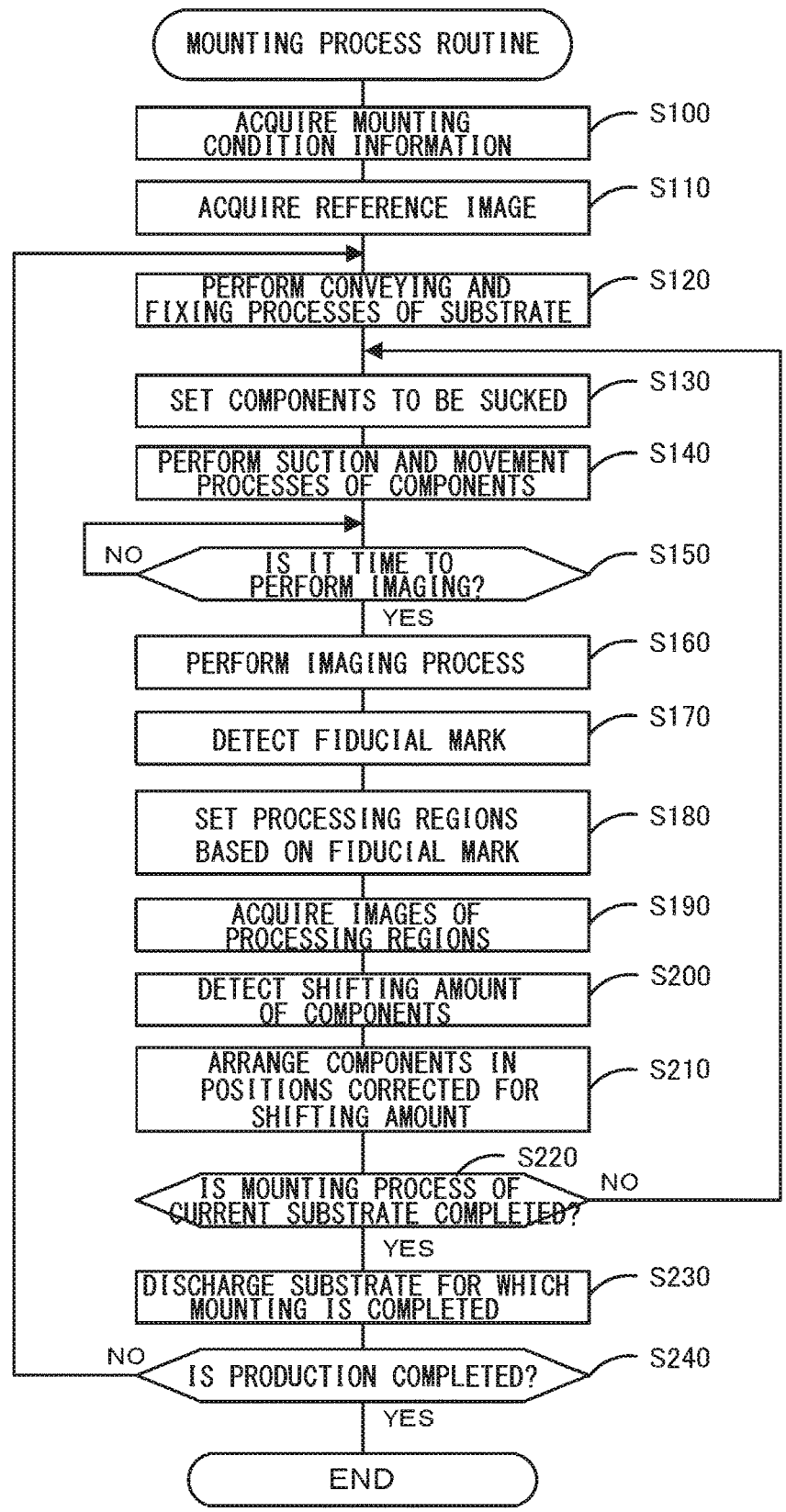
FIG. 5 is a flowchart illustrating an example of a mounting process routine.

Next, description will be given of the operations of the mounting machine 11 of the present embodiment which is configured in this manner, for example, the mounting process of imaging the component P which is sucked by the suction nozzle 40 while moving, and arranging the component P on the substrate S. FIG. 5 is a flowchart representing an example of a mounting process routine which is executed by the CPU 71 of the control device 70. This routine is stored on the HDD 73 of the control device 70 and is executed by a start instruction performed by a worker. For example, this routine is executed by the CPU 71 using the functions and the units of the imaging control section 65, the mounting control section 76, the region setting section 77, the detection section 78, and the determination section 79 which are the functional blocks of the control device 70.

When the routine is started, the CPU 71 of the control device 70 first acquires the mounting condition information from the management computer 80 and stores the mounting condition information in the HDD 73 (step S100). Next, the CPU 71 mounts the nozzle holding body 42 to the mounting head 24 and mounts the suction nozzles 40 to the nozzle holding body 42, images the mounting head 24 which sucks no component P using the camera unit 60, and acquires the result as a reference image (step S110). For example, the captured reference image is the same as that illustrated in FIG. 3A, and it is possible to ascertain the relative positional relationship (for example, coordinates or the like) between the fiducial mark 50 and each of the suction nozzles 40 from this image.

Next, the CPU 71 executes the conveying and the fixing processes of the substrate S (step S120), and sets the components P to be mounted on the substrate S based on the content of the mounting condition information (step S130). The mounting order of the components P is predetermined and is stored in the mounting condition information. Next, the CPU 71 performs the suction and movement processes of the set components P (step S140). In the suction process, the CPU 71 executes a process of moving the mounting head 24 to the pickup positions of the reel units 56 in which the corresponding components are stored, lowering the suction nozzles 40, and sucking the components P by the suction nozzles 40. In the suction process, one or more of the components may be sucked by the mounting head 24. In the movement process, the CPU 71 performs a process of causing the mounting head 24 which is sucking the components P to pass over the camera unit 60 and to move to the mounting position of the substrate S.

Subsequently, the CPU 71 determines whether it is time to perform the imaging based on whether the components P which are sucked by the mounting head 24 are above the camera unit 60 (step S150). The determination can be performed based on whether coordinate of the mounting head 24 which is managed by the mounting control section 76 are positioned above the camera unit 60 (the imaging coordinate). When it is not time to perform the imaging, the CPU 71 simply moves the mounting head 24. On the other hand, when the time to perform the imaging is reached, the CPU 71 outputs an imaging signal which causes the imaging to be executed to the camera unit 60 (step S160). The camera unit 60 which receives the imaging signal executes the imaging process of the image. Due to the camera unit 60 imaging the mounting head 24 which is moving to the mounting position, it is possible to perform the imaging process in a shorter time in comparison to a case in which, for example, the mounting head 24 is temporarily stopped and imaged. When the imaging process is executed, the CPU 71 executes a process of detecting the fiducial mark 50 contained in the captured image data (step S170). For example, the detection of the fiducial mark 50 can be performed by determining whether pixels corresponding to the color of the fiducial mark 50 is present in the center region of the image. The mounting machine 11 is set to perform the imaging when the mounting head 24 (that is, the fiducial mark 50) is present in approximately the center region. Therefore, the detection of the fiducial mark 50 is performed on a predetermined center region which is smaller than the region of the image data (refer to a center region 95 of FIG. 6 described later). In this case, it is possible to more efficiently perform the detection of the fiducial mark 50 in comparison with performing the detection of the fiducial mark 50 in relation to the entirety of the image data.

Figure 6:
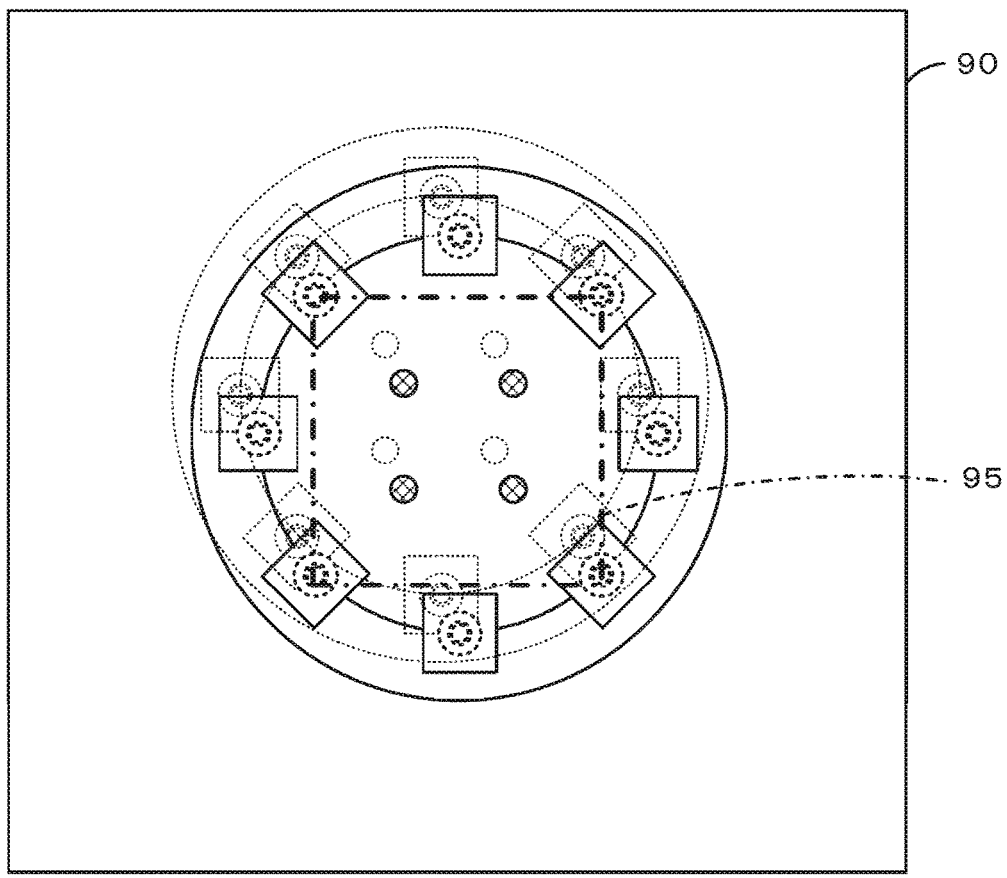
FIG. 6 is an explanatory diagram of a captured image 90 in which the moving nozzle holding body 42 is imaged.
Figure 7:
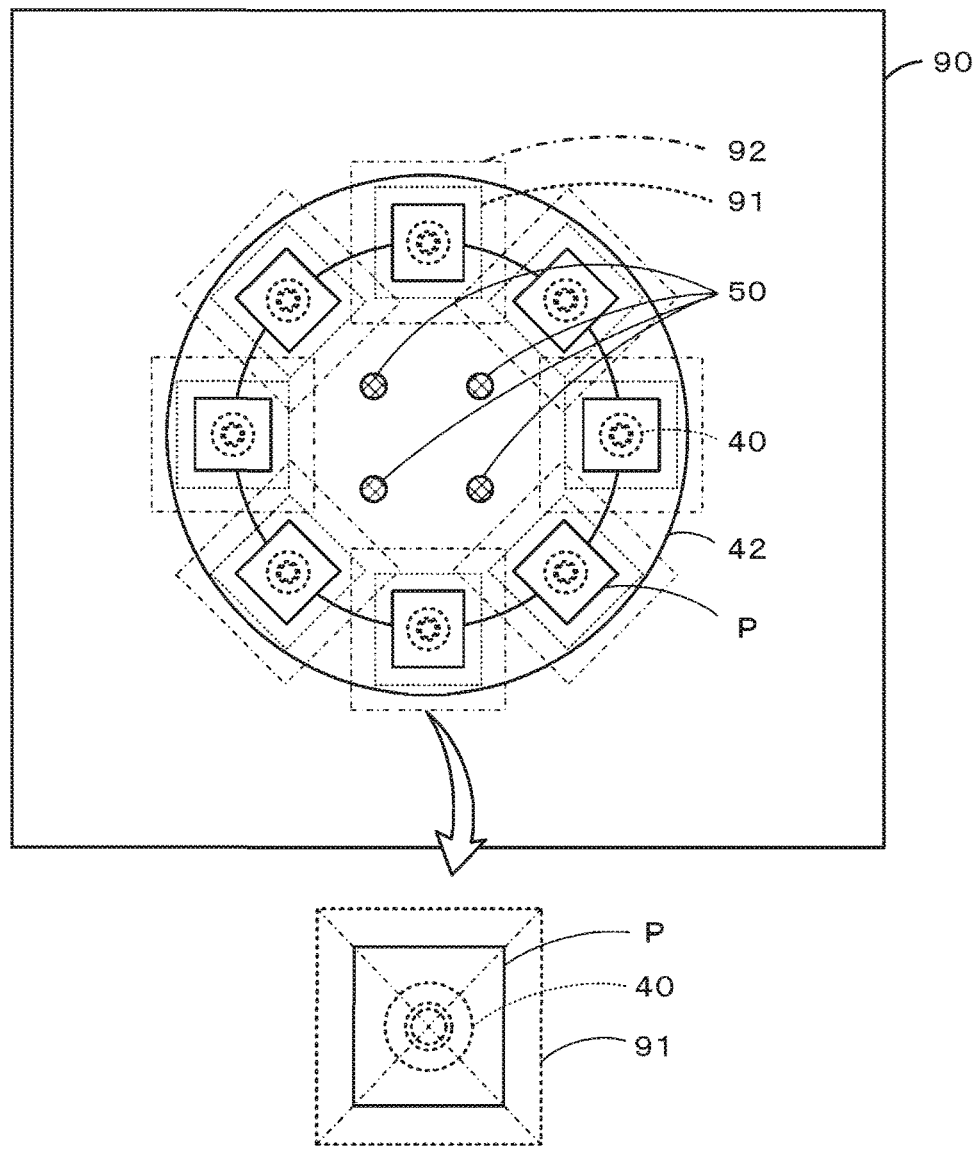
FIG. 7 is an explanatory diagram of processing regions 91 and enlarged regions 92 in the captured image 90.

When the fiducial mark 50 is detected, the CPU 71 sets the processing regions in the image in which the components P are anticipated to be present based on the position of the fiducial mark 50 (step S180). Here, description will be given of the setting of the processing region. FIG. 6 is an explanatory diagram of the captured image 90 in which the moving nozzle holding body 42 is imaged. FIG. 7 is an explanatory diagram of the processing regions 91 taking the suction shifting amount into account and the enlarged regions 92 taking pickup positional shifting into account in the captured image 90. First, using the positional relationship between the coordinate of the fiducial mark 50 of the reference image and the coordinates of the center axes of the suction nozzles 40, the CPU 71 sets the coordinates of the positions of the suction nozzles 40 to the coordinate at which this positional relationship is obtained in relation to the coordinate of the fiducial mark 50 contained in the image data which is imaged this time. Here, the coordinates of the center axis of the suction nozzle 40 are set for the plurality of suction nozzles 40. Note that, as the coordinate of the fiducial mark 50, for example, the coordinate values of four detection points may each be used, and the intersection point (center coordinate) of two corner-to-corner lines joining the four detection points may be calculated and used. As illustrated in FIG. 7, the CPU 71 sets processing regions in which the coordinates of the axial centers of the suction nozzles 40 and the center coordinates of the processing regions match. The processing region is a region of the image data in which the component P is anticipated to be present, and is set as a region which is greater than the area of the component P, taking the size of the component and the suction position shifting of the component into account.

Here, description is given of the positional shifting and the like of the component P. Generally, when picking up the component P, due to an effect such as a holding position in a tape, the component P is sucked by the suction nozzle 40 in accordance with the suction position shifting in which the center of the suction nozzle 40 is shifted from the center of the component P, and in which the component P rotates by a predetermined angle. Therefore, in the image processing for ascertaining the suction state of the component P, the presence or absence of the component P should be detected in relation to a region (the processing region 91) which takes the size and suction position shifting of the component P into account. The mounting machine 11 manages the position of the mounting head 24 according to the positions of the drive motor axes of the X-axis slider 26 and the Y-axis slider 30. The camera unit 60 performs an imaging process instantaneously when the mounting head 24 passes over predetermined imaging coordinate. However, the mounting machine 11 can only ascertain the position of the mounting head 24 in units of the control periods of the drive motor axes. Therefore, as indicated by the dotted line in FIG. 6, in the captured image 90 which is captured, the position of the mounting head 24 may be shifted, at most, by one control period. For example, when the movement speed of the mounting head 24 is 3 m/s and the unit of the control periods of the drive motor axes is 250 µs, the shifting amount (hereinafter also referred to as the pickup positional shifting) is, at most, 0.75 mm, indicating a large value which cannot be ignored with regard to the components P, for which there has been progress in miniaturization. In the image processing for ascertaining the state of the component P, when an attempt is made to perform the image processing in this state, the presence or absence of the component P should be performed on a region (the enlarged region 92) which is larger than the processing region 91 and takes the pickup positional shifting into account. As illustrated in FIG. 7, when the enlarged region 92 which takes the pickup positional shifting into consideration overlaps the adjacent enlarged regions 92, this leads to false detection. Therefore, depending on the size of the component P, the mounting head 24 cannot perform a high density arrangement of the suction nozzles 40, or, suction nozzles 40 which cannot suck components P due to the overlapping of the enlarged regions 92 arise. Therefore, in the mounting machine, the processing time of the mounting process may become longer and the efficiency may be reduced. In this mounting machine 11, the smaller processing region 91 is set, taking only the suction position shifting into account without taking the pickup positional shifting into account by providing the fiducial mark 50 on the mounting head 24 and ascertaining the position of the mounting head 24 by detecting the fiducial mark 50. In this case, even if the component is larger, it is possible to ascertain the suction state during the movement.

When the processing regions are set, the CPU 71 acquires the image data of the set processing regions (step S190). Here, of the entirety of the image data, the CPU 71 acquires the image data of the processing regions by the image data of the processing regions being transferred from the image processing section 64 of the camera unit 60. Next, the CPU 71 subjects the image data of the processing regions to image processing, and detects the state of the components, specifically, the shifting amount of the components (step S200). Hereinafter, description will be given of the detection method of the shifting amount of the component. For example, the control device 70 determines whether each pixel of the image data of the processing region is a pixel corresponding to the component P and detects the region corresponding to the component P. Next, the CPU 71 detects the center position of the processing region (that is, the axial center of the suction nozzle 40) and the center position of the sucked component P, and obtains the distance between the detected center positions as the shifting amount. At this time, the CPU 71 may obtain the rotational angle of the component P from the inclination of the shape of the component P, using the correct suction position as a reference. In this manner, it is possible to obtain the shifting amount from the center of the nozzle of the component P which is sucked by the suction nozzle 40. Note that, although omitted to facilitate description in the flowchart, the CPU 71 performs the processing without using the sucked component P in the mounting process when the detected shifting amount is greater than a threshold which is empirically determined in advance, or when the shape of the component P differs from a reference value.

Next, the CPU 71 executes a process of mounting (arranging) the components P in positions which are corrected for the detected shifting amount (step S210). At this time, when the component P is sucked in a rotated state, the CPU 71 rotates the nozzle holder 44 so as to correct that. When the components P are mounted, the CPU 71 determines whether the mounting process of the current substrate by the mounting machine 11 is completed (step S220), and when the mounting process of the current substrate is not completed, the CPU 71 executes step S130 onward. In other words, the CPU 71 sets the components P to be mounted next, causes the components P to be sucked by the suction nozzles 40, and sets the processing regions 91 containing the components P out of the captured image 90 based on the position of the fiducial mark 50. The CPU 71 detects the positional shifting amount of the components P by inspecting the inner portions of the processing regions 91 and repeatedly executes the process of arranging the components P in positions which are corrected for the positional shifting amount. Meanwhile, when the mounting process of the current substrate is completed, the CPU 71 performs a discharge process on the substrate S for which the mounting has been completed (step S230), and determines whether the production is completed based on whether the mounting process has been performed on all of the substrates S (step S240). When the mounting process has not been performed on all of the substrates S, the CPU 71 repeats the processes from step S120 onward, whereas when the mounting process has been performed on all of the substrates S, the routine is ended in this state.

Here, the correspondence relationship between the constituent elements of the present embodiment and the constituent elements of the disclosure will be made clear. The mounting head 24 of the present embodiment corresponds to the mounting head, the camera unit 60 corresponds to the imaging section, the region setting section 77 corresponds to the setting means, and the detection section 78 corresponds to the detection means.

In the mounting machine 11 described above, out of the captured image data 90 of the fiducial mark 50 and component P held by (sucked by) the moving mounting head 24, the processing region 91 containing the component P is set, based on the position of the fiducial mark 50, and the state of the component P which is sucked by the mounting head 24 is detected by processing the image data of the set processing region 91. In the mounting machine, when the moving mounting head 24 is imaged, there is a case in which shifting arises in the position of the mounting head 24. Therefore, out of the captured image data, the processing region 91 in which the component P is thought to be contained may need to be enlarged to a region which takes the positional shifting amount of the mounting head 24 into account. In this mounting machine 11, since it is possible to ascertain the position of the mounting head 24 without shifting, using the fiducial mark 50 of the mounting head 24 as a reference, it is possible to set the processing region 91 in which the component P is anticipated to be contained in the image to a smaller region which does not take the positional shifting amount of the mounting head 24 into consideration. Therefore, the mounting machine 11 of the present embodiment is capable of more efficiently detecting the state of the holding (suction) of the moving component P. In particular, the mounting machine 11 is capable of further shortening the time of the image processing in which the component P is detected when detecting the suction state of the component P. Since the mounting machine 11 sets the region containing the component P which is sucked by the mounting head 24 after ascertaining the position of the mounting head 24, it is possible to more reliably detect the suction state of the component P.

Since the mounting machine 11 sets the processing region 91 taking the size of the component and the positional shifting amount of the component into account, it is possible to set the processing region 91 to a narrower range, and this is preferable. Since the mounting machine 11 transfers the image data of the processing region 91 out of the captured image data, and processes the image data of the transferred processing region 91, in comparison to a case in which all of the captured image data is transferred, it is possible to further reduce the transferred data amount, and it is possible to more efficiently detect the suction state of the moving component P. In other words, the mounting machine 11 is capable of further shortening the processing time. Since the mounting head 24 sucks the plurality of components P and sets the plurality of processing regions 91 corresponding to these components P, that is, since the mounting head 24 has more processing regions, it is highly significant to apply the disclosure in which the suction state of the component P is more efficiently detected. For example, generally, when the processing regions in which the components P are contained overlap each other, faulty detection arises in accordance therewith, or the like, and it may not be possible to detect the states of the components which are held by the mounting head. In the mounting machine 11, since it is possible to reduce the size of each of the processing regions 91, it is possible to further suppress the overlapping of the processing regions of the components, and it is possible to perform the detection of the suction states of the components. It is possible to perform the detection of the suction states of the components even for larger components. Since the mounting head holds the plurality of components P on a circular circumference and has the fiducial mark 50 on the center portion of this circular circumference, it is easy to capture the components P and the fiducial mark 50 in the same image, and it is possible to more reliably detect the suction states of the moving components P. Since the mounting head has the fiducial mark 50 containing the detection points which are arranged on a rectangle, it is possible to more reliably obtain the fiducial position, and thus, it is possible to more reliably detect the suction states of the components P. Since the detection of the fiducial mark 50 is performed on the center region 95 which is smaller than the region of the image data, it is possible to more efficiently perform the detection of the fiducial mark 50 in comparison with performing the detection of the fiducial mark 50 in relation to the entirety of the image data.

Note that, the disclosure is not limited to the embodiment described above, and, needless to say, may be carried out in various modes within the technical scope of the disclosure.

For example, in the embodiment described above, the camera unit 60 transfers only the image data of the set processing region; however, the disclosure is not particularly limited thereto, and the entirety of the image data may be transferred. Even in this case, since the smaller processing region 91 is used in the image processing in which the component P is detected, it is possible to further shorten the processing time.

In the embodiment described above, description is given of a configuration in which the mounting head 24 sucks the plurality of components P; however, the disclosure is not particularly limited thereto, and a single component P may be sucked. Even in this case, since the smaller processing region 91 is used in the image processing in which the component P is detected, it is possible to more efficiently detect the suction state of the moving component P.

In the embodiment described above, the plurality of components P are sucked on a circular circumference and the fiducial mark 50 is present on the center portion of the circular circumference; however, the disclosure is not particularly limited thereto. For example, the fiducial mark 50 may be formed in any position, as long as the position is possible to image together with the sucked component P using the camera unit 60. For example, the plurality of components P may be sucked by the mounting head on a circular circumference and the fiducial mark may be formed outside of the circular circumference. The plurality of components P may be sucked by the mounting head on a rectangle and the fiducial mark 50 may be formed on the center portion or the outside of the rectangle.

In the embodiment described above, the mounting head 24 has the fiducial mark 50 containing the detection points which are arranged on a rectangle; however, as long as it is possible to ascertain the position of the mounting head 24, the disclosure is not particularly limited thereto, and, for example, the fiducial mark 50 may contain one or more detection points. For example, the fiducial mark may contain the detection points arranged on a triangle when there are three detection points, and may contain the detection points arranged on a triangle and in the center when there are four detection points. For example, the fiducial mark may contain the detection points arranged on a rectangle and in the middle when there are five detection points, and may contain the detection points on a pentagon. In the embodiment described above, the fiducial mark 50 containing the detection points is adopted; however, the shape of the fiducial mark 50 is not limited to the detection points, and a rectangular or polygonal region may be adopted. The detection points of the fiducial mark 50 are red; however, for example, the fiducial mark 50 may be easily distinguishable such as blue, white, black, a mirror surface, or the like.

In the embodiment described above, the detection of the fiducial mark is performed on the center region 95 which is smaller than the region of the image data; however, the disclosure is not particularly limited thereto. For example, when performing the detection of the fiducial mark from the left pixel of the topmost row to the right and from the left pixel of the second row to the right side, the control device 70 may perform the detection of the fiducial mark on a predetermined region which is anticipated to contain the top left detection point of the fiducial mark 50. At this time, since the positional relationship (the coordinates or the like) of the detection points of the fiducial mark 50 is already known, after detecting one detection point, the detection of the fiducial mark may be performed on regions which are anticipated to contain the top right, bottom left, and bottom right detection points. In this case, since the control device 70 performs the detection process of the fiducial mark on narrower regions, it is possible to more efficiently perform the detection of the suction state of the component P. Alternatively, the control device 70 may perform the detection of the fiducial mark on a region of the image data without using a predetermined region which is smaller than the region of the image data. Even in this case, since it is possible to cancel out the pickup positional shifting of the mounting head 24 based on the position of the fiducial mark 50, it is possible to more efficiently detect the suction state of the component P.

In the embodiment described above, description is given of a configuration in which the control device 70 is provided with the region setting section 77, the detection section 78, and the determination section 79; however, the disclosure is not particularly limited thereto, and the camera unit 60 may be provided with these. Even in this case, it is possible to more efficiently detect the suction state of the moving component P. In particular, when the camera unit 60 is provided with the region setting section 77 and the like, there are cases in which it is possible to omit a process such as the transferring of the image data, and this is more efficient.

In the embodiment described above, the component P is sucked by the mounting head 24; however, as long as the component P can be held by the mounting head 24, the mounting head 24 is not limited to those by means of sucking. For example, the mounting head 24 may hold the component P by engaging a gripping section with the component P.

Note that, the functional blocks of the control device 70 described above may be realized by a CPU executing software, and may be realized in hardware using a circuit or the like.

In the embodiment described above, the disclosure is described as the mounting machine 11; however, the disclosure is not particularly limited thereto, and may be a component detection method or a mode of a program thereof.

INDUSTRIAL APPLICABILITY

It is possible to use the disclosure in the technical field of mounting a component to a substrate.

REFERENCE SIGNS LIST

10: component mounting system, 11: mounting machine, 12: base, 14: mounting machine main body, 18: board conveyance device, 20: supporting board, 22: conveyor belt, 23: support pin, 24: mounting head, 26: X-axis slider, 28: guide rail, 30: Y-axis slider, 32: guide rail, 40: suction nozzle, 42: nozzle holding body, 43: motor, 44: nozzle holder, 46: Z-axis motor, 47: motor, 50: fiducial mark, 55: nozzle stocker, 56: reel unit, 60: camera unit, 61: lighting section, 62: illumination control section, 63: image sensor, 64: image processing section, 65: imaging control section, 70: control device, 71: CPU, 72: ROM, 73: HDD, 74: RAM, 75: input-output interface, 76: mounting control section, 77: region setting section, 78: detection section, 79: determination section, 80: management computer, 90: captured image, 91: processing region, 92: enlarged region, 95: center region, P: component, S substrate.

The invention claimed is:

1. A mounting machine, the mounting machine comprising:
    a mounting head which includes a fiducial mark;
    a suction nozzle attached to the mounting head, configured to hold a component, and move the component onto a substrate;
    a camera which captures a reference image and a component image, the reference image including the fiducial mark and the suction nozzle not holding the component, the component image including the component and the fiducial mark; and
    a microprocessor configured to
        detect a position of the fiducial mark;
        set a processing region for the component image based on the detected position of the fiducial mark and the reference image; and
        detect a positional shifting amount or a suction angle of the component based on the set processing region.

2. The mounting machine according to claim 1, wherein the microprocessor is further configured to set the processing region based on a size of the component and the positional shifting amount of the component.

3. The mounting machine according to claim 1, wherein the suction nozzle is configured to hold a plurality of components, and
    the microprocessor sets a plurality of processing regions corresponding to the components.

4. The mounting machine according to claim 3, wherein the suction nozzle is configured to hold the plurality of the components on a circular circumference and include the fiducial mark on a center portion of the circular circumference.

5. The mounting machine according to claim 1, wherein the fiducial mark contains detection points, which are arranged on a rectangle.

6. The mounting machine according to claim 1, wherein the microprocessor is further configured to control the camera to image the set processing region and to detect the positional shifting amount or a suction angle of the component based on a difference between reference image and the image of the set processing region.

7. The mounting machine according to claim 6, wherein the camera transfers the image of the set processing region to the microprocessor, and the microprocessor processes the image of the transferred processing region.

8. The mounting machine according to claim 1, wherein the microprocessor is further configured to determine a relative positional relationship between the fiducial mark and the suction nozzle from the reference image.

9. The mounting machine according to claim 1, wherein the microprocessor is further configured to rotate a suction nozzle holder to correct the detected positional shifting amount or the suction angle of the component, the suction nozzle being mounted on the suction nozzle holder.

10. The mounting machine according to claim 1, wherein the microprocessor is further configured to control the camera to image the set processing region and determine whether each pixel of the image of the set processing region is a pixel corresponding to the component.

11. A component detection method of a mounting machine, the mounting machine including a mounting head which has a fiducial mark, the component detection method comprising:

capturing, by a camera, a reference image and a component image, the reference image including the fiducial mark and a suction nozzle not holding a component, the component image including the component and the fiducial mark;

detecting, by a microprocessor, a position of the fiducial mark;

setting, by the microprocessor, a processing region for the component image based on the detected position of the fiducial mark and the reference image; and detecting, by the microprocessor, a positional shifting amount or a suction angle of the component based on the set processing region.

12. A mounting method of a mounting machine, the mounting machine including a mounting head which has a fiducial mark, the mounting method comprising:

capturing, by a camera, a reference image and a component image, the reference image including the fiducial mark and a suction nozzle not holding a component, the component image including the component and the fiducial mark;

detecting, by a microprocessor, a position of the fiducial mark;

setting, by the microprocessor, a processing region for the component image based on the detected position of the fiducial mark and the reference image;

detecting, by the microprocessor, a positional shifting amount or a suction angle of the component based on the set processing region;

rotating a suction nozzle holder to correct the detected positional shifting amount or the suction angle of the component, the suction nozzle being mounted on the suction nozzle holder; and mounting the component with the corrected positional shifting amount or suction angle onto a substrate.

* * * * *